(12) United States Patent
Okura

(10) Patent No.: US 11,095,276 B2
(45) Date of Patent: Aug. 17, 2021

(54) RELAXATION OSCILLATOR WITH AN AGING EFFECT REDUCTION TECHNIQUE

(71) Applicant: ams AG, Premstaetten (AT)

(72) Inventor: Tetsuro Okura, Premstaetten (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/764,689

(22) PCT Filed: Nov. 27, 2018

(86) PCT No.: PCT/EP2018/082699
§ 371 (c)(1),
(2) Date: May 15, 2020

(87) PCT Pub. No.: WO2019/105931
PCT Pub. Date: Jun. 6, 2019

(65) Prior Publication Data
US 2020/0412347 A1    Dec. 31, 2020

(30) Foreign Application Priority Data

Nov. 28, 2017    (EP) .................................. 17204038

(51) Int. Cl.
*H03K 4/501*        (2006.01)
*H03K 3/0231*       (2006.01)
*H03K 3/011*        (2006.01)

(52) U.S. Cl.
CPC ............ *H03K 4/501* (2013.01); *H03K 3/011* (2013.01); *H03K 3/0231* (2013.01)

(58) Field of Classification Search
CPC .......... H03K 4/50; H03K 4/501; H03K 4/502; H03K 3/0231; H03K 3/011
See application file for complete search history.

(56) References Cited

U.S. PATENT DOCUMENTS

| 9,287,823 | B1  | 3/2016 | Holzmann |
| 2016/0013753 | A1* | 1/2016 | Tam ........................ H03K 4/50 331/111 |
| 2016/0211852 | A1  | 7/2016 | Kim et al. |

OTHER PUBLICATIONS

Choe, K. et al.: "A precision relaxation oscillator with a self-clocked offset-cancellation scheme for implantable biomedical SoCs" 2009 IEEE International Solid-State Circuits Conference, Feb. 8, 2009, pp. 402-403, 403a.
European Patent Office, International Search Report for PCT/EP2018/082699 dated Jan. 28, 2019.

\* cited by examiner

*Primary Examiner* — Ryan Johnson
(74) *Attorney, Agent, or Firm* — MH2 Technology Law Group LLP

(57) ABSTRACT

A relaxation oscillator with an aging effect reduction technique comprises a comparator (CP) coupled with its input side (CP1, CP2) to a network comprising at least one capacitor (C, C1, C2), a plurality of transistors (M1, M2, M3, M4) and a plurality of controllable switches (SW11, . . . , SW8, SW111, . . . , SW180). The relaxation oscillator uses a switching method such that the roles of current/voltage generator's transistor and current mirror transistor are periodically swapping by the output signal of the relaxation oscillator. Reducing mismatch of operating points between current/voltage generator and current minor transistors achieves a decrease of frequency degradation caused by aging effect.

14 Claims, 8 Drawing Sheets

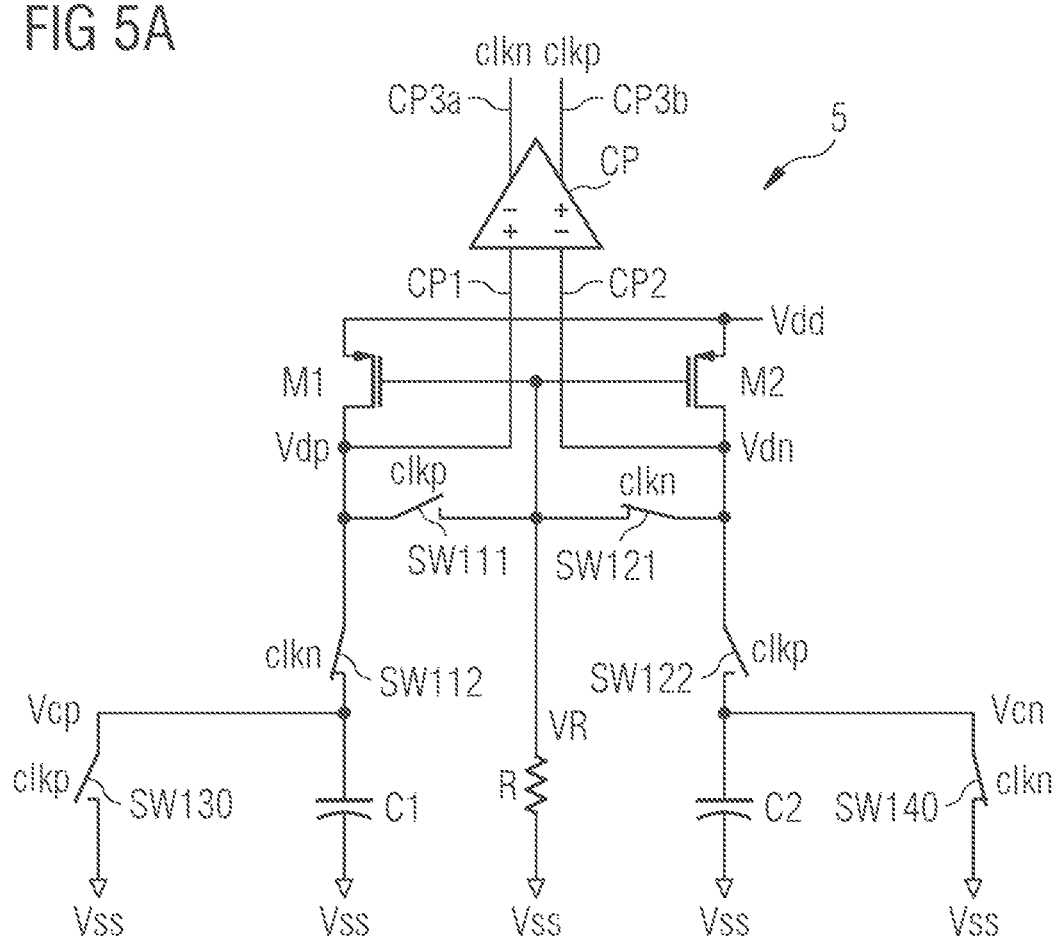

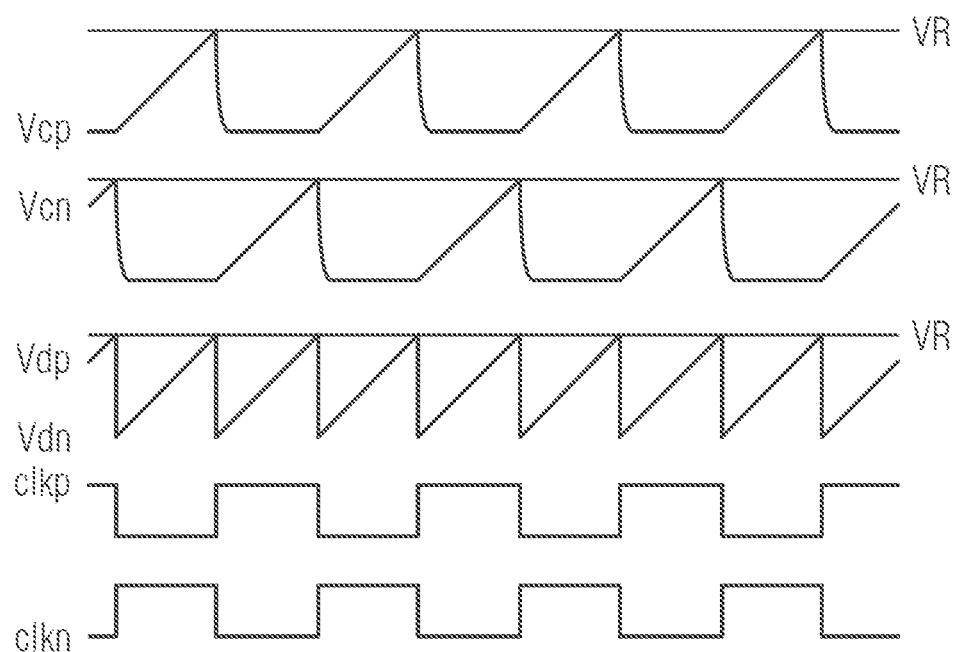

RELAXATION OSCILLATOR WITH AN AGING EFFECT REDUCTION TECHNIQUE

TECHNICAL FIELD

The disclosure relates to a relaxation oscillator with an aging effect reduction technique by reducing a channel hot carrier (CHC) effect.

BACKGROUND

The performance of a relaxation oscillator usually degrades during the operation time of the oscillator due to frequency degradation caused by aging effects, in particular by a hot channel carrier injection (HCI) and a negative bias temperature instability (NBTI). A relaxation oscillator comprises a comparator having an input side that is coupled to a network of transistors. The transistors realize a reference current/voltage generator and a current mirror. In very small technologies channel hot carrier injection causes threshold voltage shifts in the oscillator circuit. This aging effect results in frequency degradation in relaxation oscillator circuits.

Frequency change caused by a comparator offset degradation can be cancelled by periodically switching the comparator positive and negative input node connection from a ramp signal to a reference voltage.

The use of an auto-zero comparator for reducing the aging effect of the comparator implemented in a relaxation oscillator is described by K. Choe, O. Bernal, D. Nuttman and M. Je, "A Precision Relaxation Oscillator with a Self-Clocked Offset-Cancellation Scheme for Implantable Biomedical SoCs," in IEEE ISSCC Dig. Tech. Papers, 2009. Autozeroing is used to get rid of the degradation belonging to the comparator offset.

Further contribution of the frequency degradation is related to operating point mismatch between transistors of the reference current/voltage generator and the current mirror transistor. However, degradation caused by mismatch of operating points between a transistor of a reference current/voltage generator and current-mirror transistor is not able to be cancelled.

There is a desire to provide a relaxation oscillator with an aging effect reduction technique that enables the mismatch of operating points between current/voltage generator and current mirror transistors to be reduced to achieve a decrease of frequency degradation caused by an aging effect, in particular by a channel hot carrier injection.

An embodiment of a relaxation oscillator with an aging effect reduction technique to reduce the mismatch of operation points between current/voltage generator and current mirror transistors of the relaxation oscillator is specified in claim 1.

The relaxation oscillator comprises a comparator having a first input node and a second input node, wherein a reference signal is applied to at least one of the first and the second input node. The relaxation oscillator comprises at least one capacitor being connected to at least one of the first and the second input node of the comparator, and a plurality of transistors and a plurality of controllable switches.

The plurality of controllable switches are controlled during an operational cycle of the relaxation oscillator such that a charging current to charge the at least one capacitor is generated and flows through at least a first one of the plurality of transistors, and a reference current to provide the reference signal is generated and flows through at least a second one of the transistors.

The plurality of controllable switches are controlled during a subsequent operational cycle of the relaxation oscillator such that a discharging current to discharge the at least one capacitor is generated and flows through at least a third one of the plurality of transistors, and the reference current to provide the reference signal is generated and flows through at least a fourth one of the transistors.

According to an embodiment of the relaxation oscillator, the comparator comprises an output node to provide an output signal, for example a clock signal. The controllable switches of the relaxation oscillator are controlled by the output signal/clock signal of the comparator.

The relaxation oscillator uses a switching method to improve the frequency accuracy of the relaxation oscillator by reducing a channel hot carrier effect. In the switching methods, the roles of the transistors of the current/voltage generator and the current mirror transistors are periodically swapped by the own output/clock signal of the relaxation oscillator.

The accompanying drawings are included to provide a further understanding and are incorporated in and constitute a part of this specification. The drawings illustrate several embodiments of relaxation oscillators, and together with the description serve to explain principles and the operation of the various embodiments.

BRIEF DESCRIPTION OF THE DRAWINGS

FIG. 5A illustrates an embodiment of a relaxation oscillator with improved frequency accuracy by reducing a channel hot carrier effect; and FIG. 5B shows a timing diagram illustrating the operation of the relaxation oscillator of FIG. 5B.

DETAILED DESCRIPTION

Figure 1:
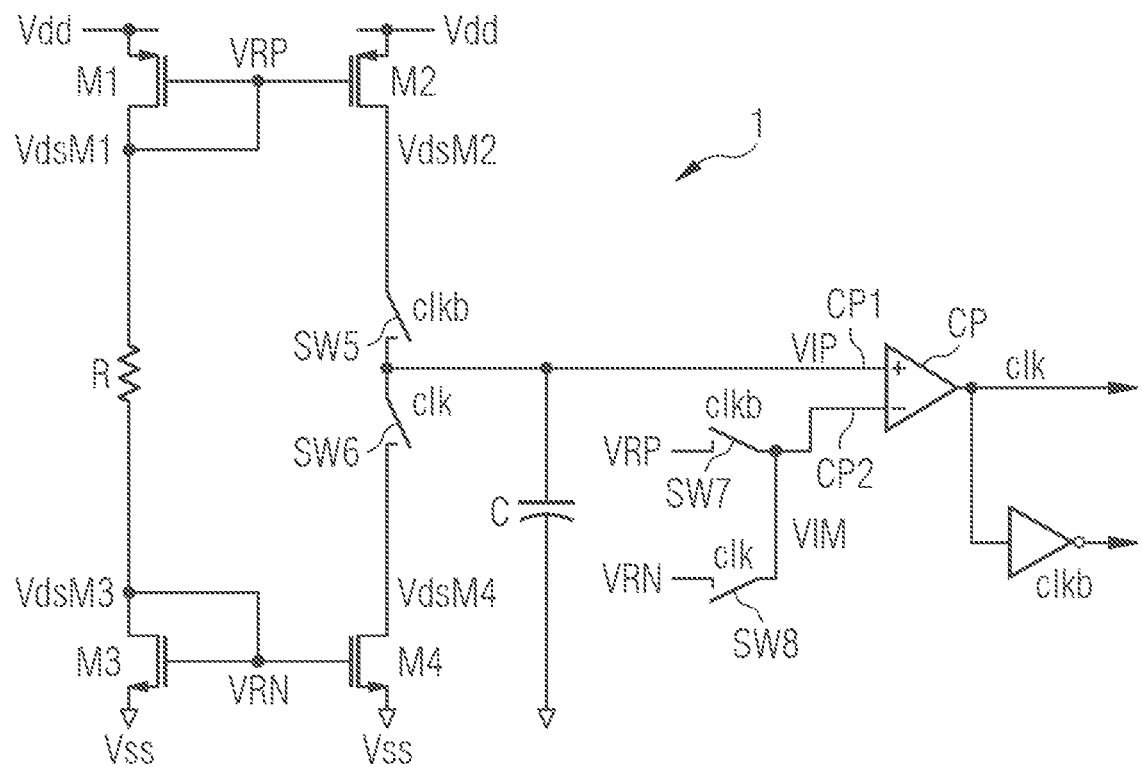
FIG. 1 shows an embodiment of a relaxation oscillator with a frequency degradation caused by a mismatch of operating points between a transistor of a reference current/voltage generator and a current mirror transistor.

FIG. 1 shows an embodiment of a relaxation oscillator 1 which generates an output/clock signal clk, clkb. The relaxation oscillator 1 comprises a comparator circuit CP having an input node CP1 to apply an input signal VIP and an input node CP2 to apply an input signal VIM. A first reference signal VRP and a second reference signal VRN can be applied to the input node CP2 by controllable switches SW7 and SW8 that are controlled by the output/clock signals clk and clkb. The input node CP1 of the comparator circuit CP is connected to a capacitor C.

The first and second reference signals VRP and VRN are generated by a current/voltage generator comprising the transistors M1 and M3 and a resistor R. The reference signal VRP is provided at a control/gate terminal of the transistors M1. The reference signal VRN is provided at a control/gate terminal of the transistor M3. The capacitor C may be charged by connecting the capacitor C via a controllable switch SW5 to the transistor M2. The capacitor C is charged by reference current generated by transistors M1 and M3 and resistor R through the current mirror M2. The capacitor C can be discharged by coupling the capacitor C via the controllable switch SW6 to the transistor M4. The capacitor C is discharged by a reference current generated by transistors M1 and M3 and resistor R through the current mirror M4.

Figure 2:
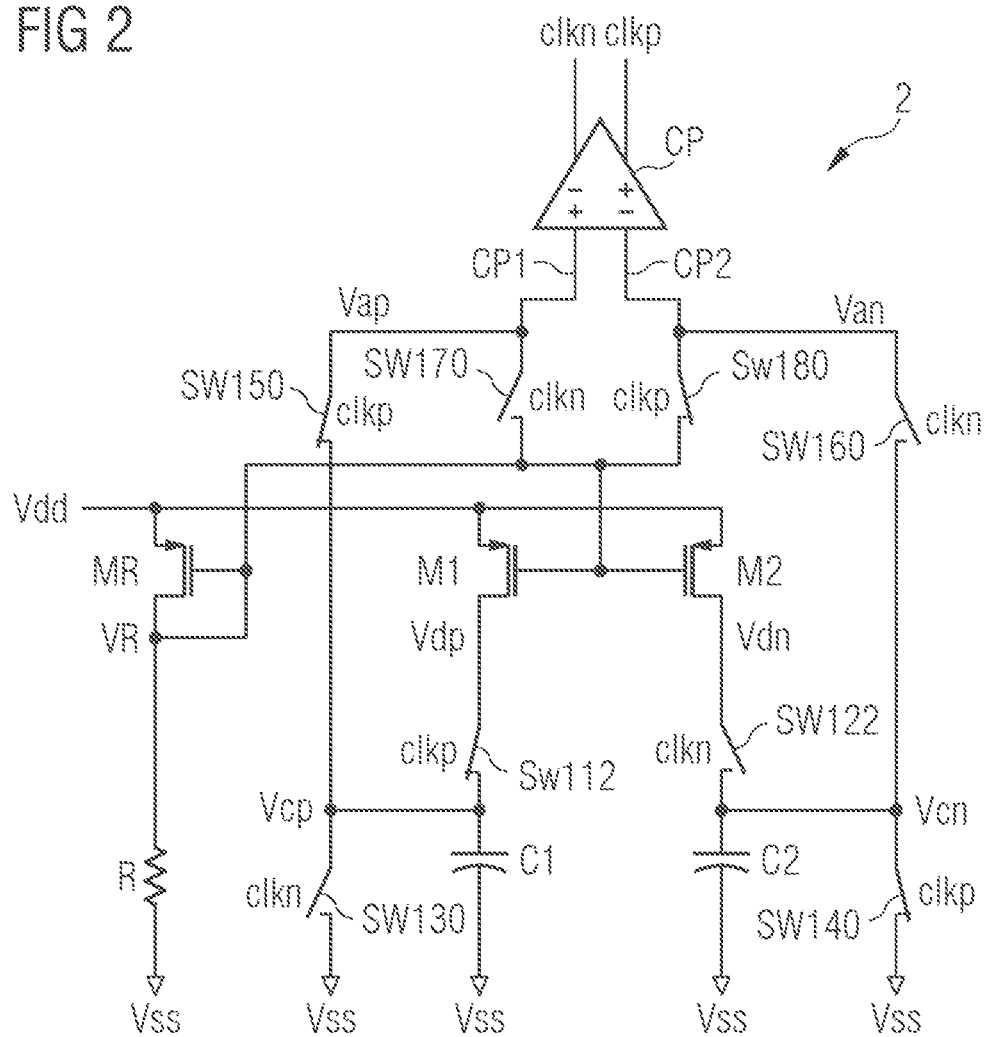
FIG. 2 shows another embodiment of a relaxation oscillator with frequency degradation caused by a mismatch of operating points between the transistor of a reference current/voltage generator and a current mirror transistor.

FIG. 2 shows another embodiment of a relaxation oscillator 2 which generates output/clock signals clkn and clkp. The relaxation oscillator comprises a comparator circuit CP having output nodes to generate the output/clock signals clkn and clkp, and an input node CP1 to apply a reference signal Vap, and an input node CP2 to apply a reference signal Van. The relaxation oscillator further comprises a current/voltage generator comprising a transistor MR and a resistor R. The transistors M1 and M2 provide a current mirror to charge capacitors C1 and C2 by a reference current generated by transistor MR and resistor R. The reference signal VR may be generated as a potential/voltage drop across the resistor R. The capacitor C1 may be charged by closing a controllable switch 112 and discharged by closing a controllable switch SW130. The capacitor C2 may be charged by closing a controllable switch SW122 and discharged by closing a controllable switch SW140.

A ramp signal Vap may be applied to the input node CP1 of the comparator circuit by coupling the input node CP1 via a controllable switch SW150 to a potential Vcp. The reference signal VR may be applied to the input node CP1 of the comparator circuit by coupling the input node CP1 via a controllable switch SW170 to the potential VR. A ramp signal Van may be applied to the input node CP2 of the comparator circuit by coupling the input node CP2 via a controllable switch SW160 to a potential Vcn, or by coupling the input node CP2 via a controllable switch SW180 to the potential VR. In nano-scale processes, channel hot carrier (CHC) causes threshold voltage degradation of NMOS and PMOS transistors. The effect of CHC is written by $$\Delta V_{th} \propto \sqrt{V_{gs} - V_{th}} \cdot \exp(V_{gs} - V_{th}) \cdot \exp\left(-\frac{L}{V_{ds} - V_{dsat}}\right),$$

where $V_{gs}$, $V_{ds}$, $V_{dsat}$ and L are gate-source voltage, drain-source voltage, saturation voltage of drain-source and channel length. The embodiments of the relaxation oscillators of FIGS. 1 and 2 show differences between the average drain-source voltage of reference generator's transistor and the current source's transistor. Therefore, degradation of the oscillation frequency occurs in the embodiments of FIGS. 1 and 2.

Regarding the oscillator circuit 1 shown in FIG. 1, the reference voltage is written by $$VRP-VRN=[I_d+\Delta(t)]\cdot R,$$

where $I_d$ and $\Delta(t)$ are initial drain current of the transistors M1/M3 and drain current degradation caused by CHC effect respectively.

Drain-source currents of transistors M2 and M4 are written by $$I_{dM2}=I_d+\Delta(t)+\Delta_2(t) \text{ and}$$

$$I_{dM4}=I_d+\Delta(t)+\Delta_4(t),$$

where $\Delta_2(t)$ and $\Delta_4(t)$ are drain current degradation of transistor M2 and transistor M4 respectively.

A period of clock cycle is $$t_{osc}=C\cdot(VRP-VRN)\cdot(I_{dM2}^{-1}+I_{dM4}^{-1}).$$

Thus, the oscillation frequency is written by the following equation:

$$f \approx \left[2CR\left(1 - \frac{\Delta_2(t) + \Delta_4(t)}{2I_d}\right)\right]^{-1}.$$

Regarding the oscillator circuit 2 of FIG. 2, the reference voltage is written by $$VR=[I_{dMR}+\Delta_R(t)]\cdot R,$$

where $I_{dMR}$ and $\Delta_R(t)$ are initial drain current of transistor MR and drain current degradation caused by CHC effect respectively.

The drain-source current of transistors M1 and M2 are written by $$I=I_{dM1}=I_{dMR}+\Delta(t)+\Delta_1(t) \text{ and}$$

$$I_{dM2}=I_{dMR}+\Delta(t)+\Delta_2(t),$$

where $\Delta_1(t)$ and $\Delta_2(t)$ are drain current degradation of transistors M1 and M2 respectively.

A period of clock cycle is $$t_{osc}=C\cdot VR\cdot(I_{dM1}^{-1}+I_{dM2}^{-1}).$$

Therefore, the oscillation frequency of the oscillator circuit of FIG. 2 is written by the following equation:

$$f \approx \left[2CR\left(1 - \frac{\Delta_1(t) + \Delta_2(t)}{2I_{dR}}\right)\right]^{-1}.$$

For both of the embodiments of the relaxation oscillators 1 and 2, the oscillation frequency depends on the degradation of the transistors.

Figure 3A:
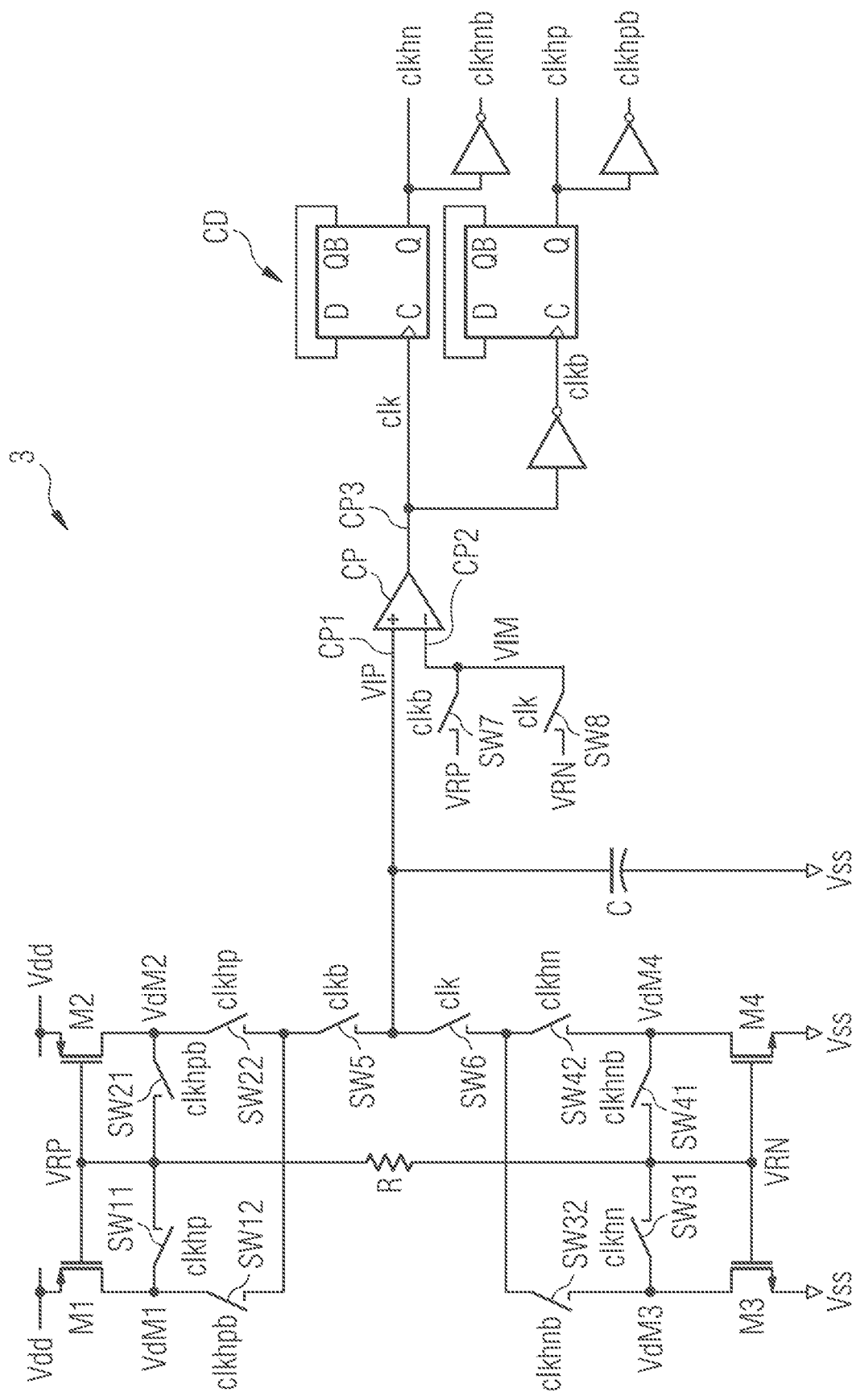
FIG. 3A illustrates an embodiment of a relaxation oscillator with improved frequency accuracy by reducing a channel hot carrier effect.
Figure 4A:
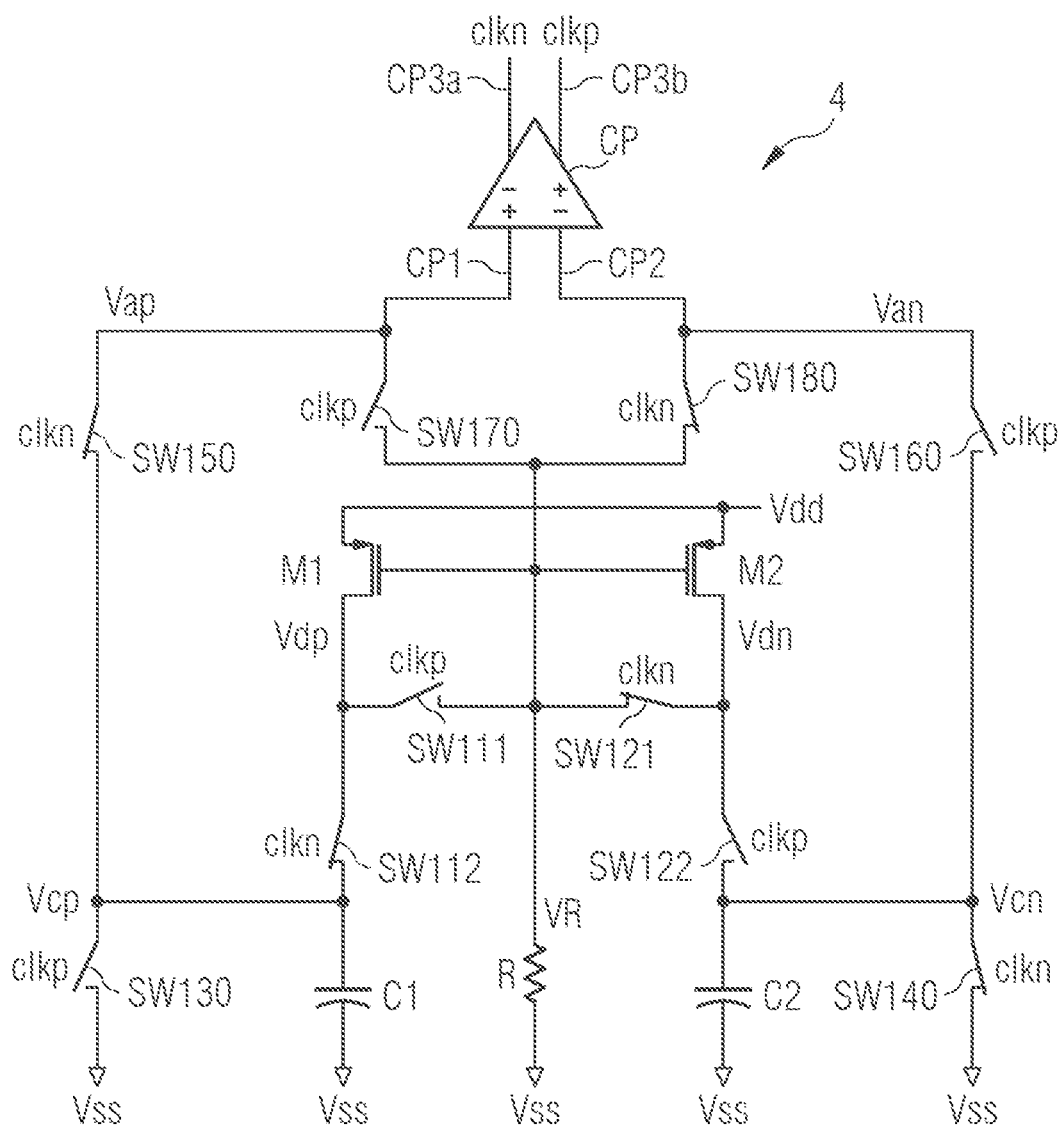
FIG. 4A shows another embodiment of a relaxation oscillator with improved frequency accuracy by reducing a channel hot carrier effect.

FIGS. 3A, 4A and 5A show different embodiments of relaxation oscillators 3, 4 and 5 by which novel switching methods are implemented. The novel switching methods improve frequency accuracy of the relaxation oscillator by reducing CHC effect. In novel switching methods, the roles of current/voltage generator's transistor and current mirror transistor of the relaxation oscillators are periodically swapping by their own output/clock signal. Reducing mismatch of operating points between current/voltage generator and current mirror transistors achieves a decrease of frequency degradation caused by aging effect, CHC.

According to the embodiments of the relaxation oscillators shown in FIGS. 3A, 4A and 5A, the relaxation oscillators comprise a comparator CP having a first input node CP1 and a second input node CP2. A reference signal VRP, VRN (FIG. 3A) or VR (FIGS. 4A and 5A) is applied to at least one of the first and the second input node CP1, CP2 of the comparator circuit. The oscillators comprise at least one capacitor C (FIG. 3A), or C1, C2 (FIGS. 4A and 5A) being connected to at least one of the first and the second input node CP1, CP2 of the comparator CP.

Referring to FIG. 3A, the relaxation oscillator comprise a plurality of transistors M1, M2, M3, M4 and a plurality of controllable switches SW11, ..., SW8. The plurality of controllable switches are controlled during an operational cycle of the relaxation oscillator, for example the operational cycle OC2 shown in FIG. 3B, such that a charging current to charge the capacitor C flows through a transistor M1 and a controllable switch SW5, and a charge current and the reference signal/voltage VRP and VRN are generated by the transistors M2 and M3, and a resistor R.

Figure 3B:
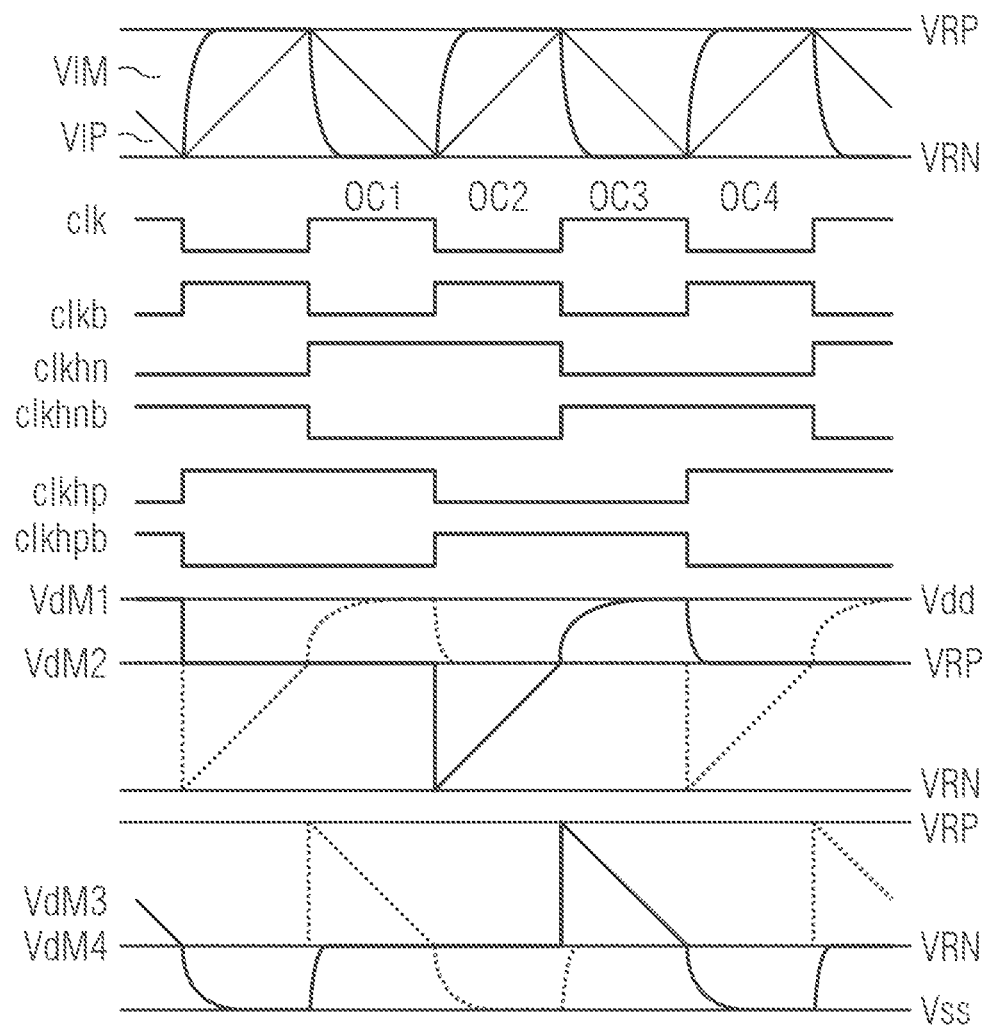
FIG. 3B shows a timing diagram illustrating the operation of the relaxation oscillator of FIG. 3A.

The plurality of controllable switches are controlled during a subsequent operational cycle of the relaxation oscillator, for example the operational cycle OC3 shown in FIG. 3B, such that a discharging current to discharge the capacitor C flows through a transistor M3 and a controllable switch SW6, and the discharge current and the reference signal/voltage VRP, VRN are generated by the transistors M2 and M4 and the resistor R.

Referring to FIGS. 4A and 5A, the relaxation oscillators comprise a plurality of transistors M1, M2 and a plurality of controllable switches SW111, . . . , SW180 (FIG. 4A) and SW111, . . . , SW140 (FIG. 5A). The plurality of controllable switches are controlled during an operational cycle of the relaxation oscillators, for example the operational cycle of clkp=1 shown in FIG. 4B/5B, such that a charging current to charge the capacitor C2 flows through transistor M2 and controllable switch SW112, and a reference current and the reference signal/voltage VR are generated by transistor M1 and resistor R. On the other hand, the capacitor C1 discharged by controllable switch SW130.

Figure 4B:
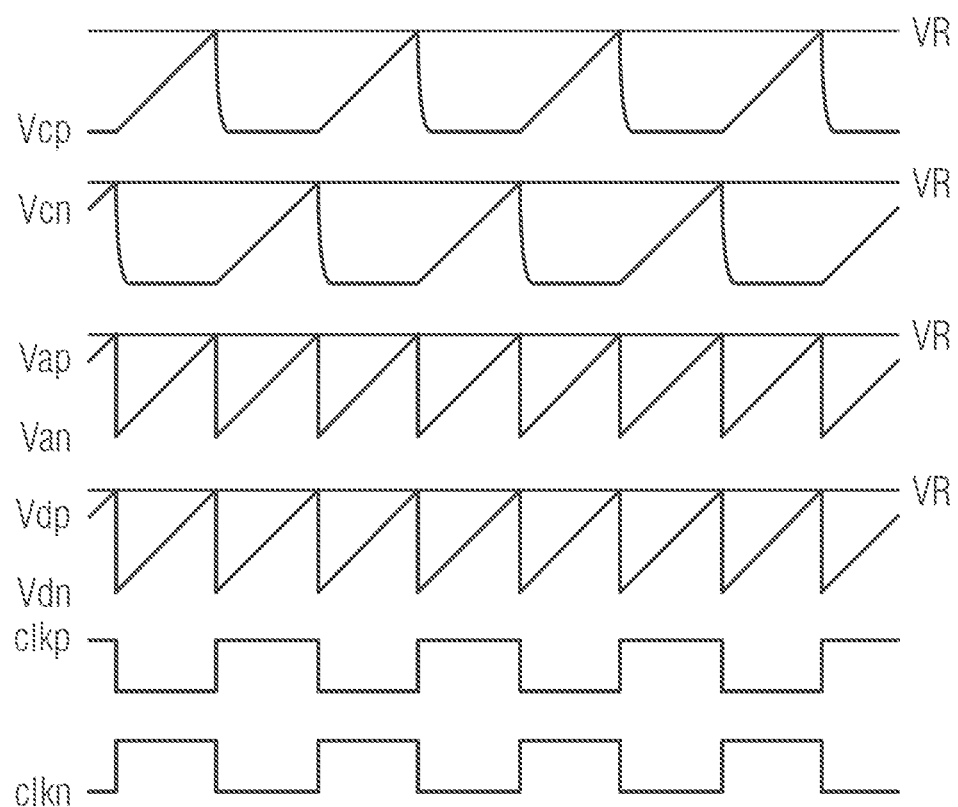
FIG. 4B shows a timing diagram illustrating the operation of the relaxation oscillator of FIG. 4A.

The plurality of controllable switches are controlled during a subsequent operational cycle of the relaxation oscillator, for example the operational cycle clkn=1 shown in FIG. 4B/5B, such that a charging current to charge the capacitor C1 flows through the transistors M1 and controllable switch SW112, and the reference current and the reference signal/voltage VR are generated by the transistor M2 and the resistor R. On the other hand, the capacitor C2 is discharged by the controllable switch SW140.

The comparator CP comprises an output node CP3 (FIG. 3A), or CP3a, CP3b (FIGS. 4A and 5A) to provide an output signal clk (FIG. 3A), or clkn, clkp (FIGS. 4A and 5A). The controllable switches of the relaxation oscillators of FIGS. 3A, 4A and 5A are controlled by the output signal clk, or clkn, clkp of the comparator CP. The respective output signal by which a controllable switch is controlled is directly written to the respective controllable switch in FIGS. 3A, 4A and 5A.

The output/clock signals clk, clkhn and clkhp may have a high/1-level or a low/0-level. When one of the controllable switches is controlled by the associated output/clock signal having the high/1-level, the respective controllable switch is turned in the closed state, i.e. is switched in the conductive state. When one of the controllable switches is controlled by the associated output/clock signal having the low/0-level, the respective controllable switch is turned in the open state, i.e. is switched in the non-conductive state.

The relaxation oscillators shown in FIGS. 3A, 4A and 5A comprise a plurality of activatable reference current paths being arranged between a supply potential Vdd and a ground potential Vss. The controllable switches are configured to activate one of the activatable reference current paths so that the supply potential Vdd and the ground potential Vss are conductively connected through the activated reference current path and the reference current flows in the activated reference current path.

The controllable switches are configured to deactivate the remaining of the activatable reference current paths so that a conductive connection between the supply potential Vdd and the ground potential Vss through the remaining of the activatable reference current paths is blocked. The level of the reference signal depends on the reference current, the reference current flowing in the activated reference current path.

The relaxation oscillators of FIGS. 3A, 4A and 5A comprise a resistor R. The activatable reference current paths are arranged so that the resistor R is arranged in each of the activatable reference current paths. The level of the reference signal depends on the voltage drop at the resistor R.

The relaxation oscillators shown in FIGS. 3A, 4A and 5A comprise a plurality of activatable charging current paths. Each of the activatable charging current paths is configured to conductively connect the supply potential Vdd to the at least one capacitor C (FIG. 3A), or C1, C2 (FIGS. 4A and 5A) to provide the charging current to charge the at least one capacitor C, or C1, C2, when the respective one of the activatable charging current paths is operated in the activated state. Each of the activatable charging current paths is configured to isolate the supply potential Vdd from the at least one capacitor C, or C1, C2, when the respective one of the activatable charging current paths is operated in the deactivated state.

The relaxation oscillators shown in FIGS. 3A, 4A and 5A comprise a plurality of activatable discharging current paths. Each of the activatable discharging current paths is configured to conductively connect the ground potential Vss to the at least one capacitor C (FIG. 3A), or C1, C2 (FIGS. 4A and 5A) to provide the discharging current to discharge the at least one capacitor C, or C1, C2, when the respective one of the activatable discharging current paths is operated in the activated state. In the embodiments of FIGS. 4A/5A, the capacitor C1 or C2 is directly reset to the ground potential Vss by the controllable switch SW130 or SW140. Each of the activatable discharging current paths is configured to isolate the ground potential Vss from the at least one capacitor C, or C1, C2, when the respective one of the activatable discharging current paths is operated in the deactivated state.

FIG. 3A illustrates a first embodiment of a relaxation oscillator 3 with improved frequency accuracy by reducing a channel hot carrier effect. According to the embodiment of the relaxation oscillator 3, the second input node CP2 of the comparator CP is connectable via a controllable switch SW7 to a first one of the reference signals VRP. The second input node CP2 of the comparator CP is connectable via a controllable switch SW8 to a second one of the reference signals VRN.

A first one of the plurality of activatable reference current paths comprises the at least one first transistor M1, a controllable switch SW11, a controllable switch SW31 and the at least one third transistor M3. In the activated state of the first activatable reference current path, the at least one first transistor M1 is connected to the supply potential Vdd and is connected to the resistor R via the controllable switch SW11. In the activated state of the first activatable reference current path, the at least one third transistor M3 is connected to the ground potential Vss and is connected to the resistor R via the controllable switch SW31.

A first one of the plurality of activatable discharging current paths comprises the at least one fourth transistor M4 and a controllable switch SW42. In the activated state of the first discharging current path, the at least one fourth transistor M4 is connected to the ground potential Vss and is connected to the at least one capacitor C via the controllable switch SW42.

A second one of the plurality of activatable reference current paths comprises the at least one second transistor M2, the controllable switch SW31, a controllable switch SW21, and the at least one third transistor M3. In the activated state of the second activatable reference current path, the at least one second transistor M2 is connected to the supply potential Vdd and is connected to the resistor R via the controllable switch SW21. In the activated state of the second activatable current path, the at least one third transistor M3 is connected to the ground potential Vss and is connected to the resistor R via the controllable switch SW31.

A first one of the plurality of activatable charging current paths comprises the at least one first transistor M1 and a controllable switch SW12. In the activated state of the first activatable charging current path, the at least one first transistor M1 is connected to the supply potential Vdd and is connected to the at least one capacitor C via the controllable switch SW12.

A third one of the plurality of activatable reference current paths comprises the at least one second transistor M2, the controllable switch SW21, a controllable switch SW41, and the at least one fourth transistor M4. In the activated state of the third activatable reference current path, the at least one second transistor M2 is connected to the supply potential Vdd and is connected to the resistor R via the controllable switch SW21. In the activated state of the third activatable reference current path, the at least one fourth transistor M4 is connected to the ground potential Vss and is connected to the resistor R via the controllable switch SW41.

A second one of the plurality of activatable discharging current paths comprises the at least one third transistor M3 and a controllable switch SW32. In the activated state of the second activatable discharging current path, the at least one third transistor M3 is connected to the ground potential Vss and is connected to the at least one capacitor C via the controllable switch SW32.

A fourth one of the plurality of activatable reference current paths comprises the at least one first transistor M1, the controllable switch SW11, the controllable switch SW41, and the at least one fourth transistor M4. In the activated state of the fourth activatable reference current path, the at least one first transistor M1 is connected to the supply potential Vdd and is connected to the resistor R via the controllable switch SW11. In the activated state of the fourth activatable reference current path, the at least one fourth transistor M4 is connected to the ground potential Vss and is connected to the resistor R via the controllable switch SW41.

A second one of the plurality of activatable charging current paths comprises the at least one second transistor M2 and a controllable switch SW22. In the activated state of the second activatable charging current path, the at least one second transistor M2 is connected to the supply potential Vdd and is connected to the at least one capacitor C via the controllable switch SW22.

The operation of the relaxation oscillator of FIG. 3A is explained in the following with reference to the timing diagram of FIG. 3B.

As shown in FIG. 3B, the output/clock signals clk, clkhn and clkhp have the high/1-level during the operational cycle OC1. Since the controllable switches SW42 and SW6 are turned in the conductive state, a drain node of transistor M4 is connected to the capacitor C and the positive input node CP1 of comparator CP. The capacitor C is discharged by the drain current of transistor M4. Reference voltages VRP, VRN and the reference current are generated by transistors M1, M3 and the resistor R. The reference current path is activated by turning the controllable switches SW11 and SW31 in the conductive state by the high-level of the output signals clkhp and clkhn during the operational cycle OC1.

Once a voltage of the positive input node CP1 of the comparator CP becomes lower than VRN, the output/clock signals clk and clkhp turn to the low/0-level during the operational cycle OC2. As a consequence, the capacitor C is charged by the drain current of transistor M1 which is connected to the capacitor C by the closed controllable switches SW12 and SW5 until the potential at the input node CP1 of the comparator CP reaches the potential VRP applied to the input node CP2 by the closed controllable switch SW7. The transistors M2, M3 and the resistor R generate the reference signal/potential VRP and the reference current. To this purpose, the reference current path comprising the transistors M2, M3 and the resistor R is switched in the activated state by turning the controllable switches SW21 and SW31 in the conductive state.

After the potential VIP at the input node CP1 of the comparator becomes larger than the potential VRP, the output/clock signals clk and clkhn turn to the high/1-level and to the low/0-level respectively during the operational cycle OC3. As a consequence, the controllable switches SW32 and SW6 are turned in the conductive state and a drain current of transistor M3 discharges the capacitor C. The potential/reference signal VRN and the reference current are generated by operating a reference current path comprising the transistors M2, M4 and the resistor R in the activated state by turning the controllable switches SW21 and SW41 in the conductive state.

During the operational cycle OC4, the clock/output signals clk and clkhp turn the low/0-level and the high/1-level respectively when the potential VIP at the input node CP1 of the comparator CP reaches the potential VRN applied to the input node CP2 of the comparator. At this phase, the reference voltage and current are generated by operating the reference current path comprising the transistors M1, M4 and the resistor R in the activated state. To this purpose, the controllable switches SW11 and SW41 are turned in the conductive state. The capacitor C is charged by the activated charging path comprising the transistor M2 that is connected to the capacitor C via the closed controllable switches SW22 and SW5.

The relaxation oscillator uses the charge and discharge times of a capacitor to generate an output/clock signal. The controllable switches SW11, SW12, SW21 and SW22 swap roles of transistors M1 and M2 periodically. In the similar way, roles of transistors M3 and M4 are swapped by the controllable switches SW31, SW32, SW41 and SW42.

Each average drain-source voltage of transistors M1 and M2 (M3 and M4) becomes the same through the above behaviours. Drain current degradation of transistors caused by CHC depends on drain-source voltage. Therefore, the drain current of transistor M1 (M3) degrades the same as transistor M2 (M4) through aging. The frequency degradation of relaxation oscillator caused by a mismatch between each of the average drain-source voltages of transistor M1 (M3) and transistor M2 (M4) is able to be cancelled.

FIG. 4A shows another embodiment of a relaxation oscillator 4 having improved frequency accuracy by reducing a channel hot carrier effect. The relaxation oscillator 4 generates the output/clock signals clkn, clkp. The oscillator 4 comprises a comparator CP having input nodes CP1 and CP2. An input signal Vap is applied to the input node CP1, and an input signal Van is applied to the input node CP2 of the comparator CP.

The relaxation oscillator 4 comprises a current/voltage generator comprising the transistors M1 and M2 and the resistor R. A capacitor C1 may be charged by a charging current path comprising the transistor M1 and a controllable switch SW112 being controlled by the output/clock signal clkn. The capacitor C1 is discharged via the controllable switch SW130 being controlled by the output/clock signal clkp. A capacitor C2 may be charged by means of a charging current path comprising the transistor M2 and the controllable switch SW122 being controlled by the output/clock signal clkp. The capacitor C2 can be discharged by means of controllable switch SW140 being controlled by output/clock signal clkn.

A reference potential VR is generated by a voltage drop at a resistor R. A reference current through the resistor R can be generated via a reference current path comprising the transistor M1 and the controllable switch SW111 being controlled by the output/clock signal clkp. Furthermore, the reference current through resistor R may be generated by another reference current path comprising the transistor M2 and controllable switch SW121 being controlled by the output/clock signal clkn.

The reference signal VR can be applied to one of the input nodes CP1, CP2 of the comparator CP by means of controllable switches SW170 and SW180. The input node CP1 of comparator CP can be coupled to the capacitor C1 to apply the input signal/potential Vcp by means of a controllable switch SW150 being controlled by the output/clock signal clkn. The input node CP2 of comparator CP may be coupled to the capacitor C2 to apply the input signal/potential Vcn by means of the controllable switch SW160 being controlled by the output/clock signal clkp. The signal Vcp is to be compared to the signal VR by the comparator CP.

FIG. 4B shows a timing diagram of the potentials and output/clock signals to control the controllable switches of the relaxation oscillator 4 to illustrate the operation of the relaxation oscillator.

FIG. 4A shows the configuration of the relaxation oscillator 4, when the output/clock signal clkp has the low/0-level and the output/clock signal clkn has the high/1-level. The activated reference current path comprising the transistor M2 and the resistor R generates the reference current and the reference voltage VR. The drain-source current of transistor M1 charges the capacitor C until the potential Vcp becomes larger than the potential VR. The capacitor C2 is discharged by the closed controllable switch SW140.

Once the potential Vcp becomes larger than the potential VR, the output/clock signals clkp and clkn change their levels so that the output/clock signal clkp has the high/1-level and the output/clock signal clkn has the low/0-level respectively. In this operational phase, a reference current path is activated comprising the transistor M1 and the resistor R to generate the reference current and voltage VR, and the drain-source current of transistor M2 charges the capacitor C2. The capacitor C1 is discharged by the closed controllable switch SW130.

Regarding the relaxation oscillator 4, the reference voltage VR is written by $$VR_{clkp=0} = I_{dM2} \cdot R(@clkp=0),$$

$$VR_{clkp=1} = I_{dM1} \cdot R(@clkp=1).$$

The CHC effect of transistors M1 and M2 is completely the same because of swapping switches. Thus, the relationship between $I_{dM1}$ and $I_{dM2}$ after aging is $$I_{dM1} = I_{dM2}.$$

The period of clock cycle and oscillation frequency are written by $$t_{osc} = C \cdot (VR_{clkp=0} \cdot I_{dM1}^{-1} + VR_{clkp=1} \cdot I_{dM2}^{-1}),$$

$$f \approx \tfrac{1}{2}CR.$$

The oscillation frequency does not include CHC effects. Each average voltage of the positive input node and the negative node of the comparator becomes the same voltage through periodically swapping by switches, SW150, SW160, SW170 and SW180. Furthermore, the average drain-source voltage of transistor M1 becomes the same as the average drain-source voltage of the transistor M2 through the controllable switches SW111 and SW121.

FIG. 5A illustrates another embodiment of a relaxation oscillator 5 with improved frequency accuracy by reducing a channel hot carrier effect. FIG. 5B shows the associated timing diagram of the output/clock signal to control the controllable switches and the potentials Vdp, Vdn, Vcp and Vcn of internal nodes of the relaxation oscillator 5 of FIG. 5A.

The embodiment of the relaxation oscillator 5 is similar to the embodiment of the relaxation oscillator 4. In particular, when comparing both embodiments, it is evident that the relaxation oscillator 5 does not comprise controllable switches SW150, SW160, SW170 and SW180. Removing of controllable switches SW150, SW160, SW170 and SW180 is possible, if the resistance of resistor R is enough larger than on-resistance of controllable switches SW112 and SW122.

LIST OF REFERENCE SIGNS

1, . . . , 5 embodiments of relaxation oscillators
CP comparator
CP1, CP2 input nodes of comparator
CP3, CP3a, CP3b output node of comparator
CD clock divider
C, C1, C2 capacitor
SWxx controllable switches
M1, . . . , M4 transistors
R resistor
clk output/clock signal
clkb inverted output/clock signal

The invention claimed is:

1. A relaxation oscillator with an aging effect reduction technique, comprising:
 a comparator having a first input node and a second input node, wherein a reference signal is applied to at least one of the first and the second input node of the comparator,
 at least one capacitor being connected to at least one of the first and the second input node of the comparator,
 a plurality of transistors and a plurality of controllable switches,
 wherein the plurality of controllable switches are controlled during an operational cycle of the relaxation oscillator such that a charging current to charge the at least one capacitor is generated and flows through at least a first one of the plurality of transistors, and a reference current to provide the reference signal is generated and flows through at least a second one of the transistors,
 wherein the plurality of controllable switches are controlled during a subsequent operational cycle of the relaxation oscillator such that a discharging current to discharge the at least one capacitor is generated and flows through at least a third one of the plurality of transistors, and the reference current to provide the reference signal is generated and flows through at least a fourth one of the transistors, and a plurality of activatable discharging current paths, wherein each of the activatable discharging current paths is configured to conductively connect a reference potential to the at least one capacitor to provide the discharging current to discharge the at least one capacitor, when the respective one of the activatable discharging current paths is operated in the activated state, and wherein each of the activatable discharging current paths is configured to isolate the reference potential from the at least one capacitor, when the respective one of the activatable discharging current paths is operated in the deactivated state.

2. The relaxation oscillator of claim 1, wherein the comparator comprises an output node to provide an output signal, wherein the controllable switches are controlled by the output signal of the comparator.

3. The relaxation oscillator of claim 1, comprising:

a plurality of activatable reference current paths being arranged between a supply potential and a reference potential, wherein the controllable switches are configured to activate one of the activatable reference current paths so that the supply potential and the reference potential are conductively connected through the activated reference current path and the reference current flows in the activated reference current path, wherein the controllable switches are configured to deactivate the remaining of the activatable reference current paths so that a conductive connection between the supply potential and the reference potential through the remaining of the activatable reference current paths is blocked, wherein the level of the reference signal depends on the reference current.

4. The relaxation oscillator of claim 3, comprising:

a resistor, wherein the activatable reference current paths are arranged so that the resistor is arranged in each of the activatable reference current paths, wherein the level of the reference signal depends on the voltage drop at the resistor.

5. The relaxation oscillator of claim 1, comprising:

a plurality of activatable charging current paths, wherein each of the activatable charging current paths is configured to conductively connect the supply potential to the at least one capacitor to provide the charging current to charge the at least one capacitor, when the respective one of the activatable charging current paths is operated in the activated state, wherein each of the activatable charging current paths is configured to isolate the supply potential from the at least one capacitor, when the respective one of the activatable charging current paths is operated in the deactivated state.

6. The relaxation oscillator of claim 1, wherein the second input node of the comparator is connectable via a first one of the controllable switches to the reference signal comprising a first reference signal, wherein the second input node of the comparator is connectable via a second one of the controllable switches to the reference signal comprising a second reference signal.

7. The relaxation oscillator of claim 3, wherein a first one of the plurality of activatable reference current paths comprises the at least one first transistor, a third one of the controllable switches, a fourth one of the controllable switches and the at least one third transistor, wherein, in the activated state of the first activatable reference current path, the at least one first transistor is connected to the supply potential and is connected to the resistor via the third controllable switch, wherein, in the activated state of the first activatable reference current path, the at least one third transistor is connected to the reference potential and is connected to the resistor via the fourth controllable switch.

8. The relaxation oscillator of claim 1, wherein a first one of the plurality of activatable discharging current paths comprises the at least one fourth transistor and a fifth controllable switch, wherein, in the activated state of the first discharging current path, the at least one fourth transistor is connected to the reference potential and is connected to the at least one capacitor via the fifth controllable switch.

9. The relaxation oscillator of claim 3, wherein a second one of the plurality of activatable reference current paths comprises the at least one second transistor, the fourth controllable switch, a sixth one of the controllable switches, and the at least one third transistor, wherein, in the activated state of the second activatable reference current path, the at least one second transistor is connected to the supply potential and is connected to the resistor via the sixth controllable switch, wherein, in the activated state of the second activatable reference current path, the at least one third transistor is connected to the reference potential and is connected to the resistor via the fourth controllable switch.

10. The relaxation oscillator of claim 5, wherein a first one of the plurality of activatable charging current paths comprises the at least one first transistor and a seventh controllable switch, wherein, in the activated state of the first activatable charging current path, the at least one first transistor is connected to the supply potential and is connected to the at least one capacitor via the seventh controllable switch.

11. The relaxation oscillator of claim 3, wherein a third one of the plurality of activatable reference current paths comprises the at least one second transistor, a sixth controllable switch, an eighth one of the controllable switches, and the at least one fourth transistor, wherein, in the activated state of the third activatable reference current path, the at least one second transistor is connected to the supply potential and is connected to the resistor via the sixth controllable switch, wherein, in the activated state of the third activatable reference current path, the at least one fourth transistor is connected to the reference potential and is connected to the resistor via the eighth controllable switch.

12. The relaxation oscillator of claim 1,
wherein a second one of the plurality of activatable discharging current paths comprises the at least one third transistor and a ninth one of the controllable switches,
wherein, in the activated state of the second activatable discharging current path, the at least one third transistor is connected to the reference potential and is connected to the at least one capacitor via the ninth controllable switch.

13. The relaxation oscillator of claim 3,
wherein a fourth one of the plurality of activatable reference current paths comprises the at least one first transistor, the third controllable switch, the eighth controllable switch and the at least one fourth transistor,
wherein, in the activated state of the fourth activatable reference current path, the at least one first transistor is connected to the supply potential and is connected to the resistor via the third controllable switch,
wherein, in the activated state of the fourth activatable reference current path, the at least one fourth transistor is connected to the reference potential and is connected to the resistor via the eighth controllable switch.

14. The relaxation oscillator of claim 5,
wherein a second one of the plurality of activatable charging current paths comprises the at least one second transistor-(M3) and a tenth one of the controllable switches,
wherein, in the activated state of the second activatable charging current path, the at least one second transistor is connected to the supply potential and is connected to the at least one capacitor via the tenth controllable switch.

* * * * *